US005707683A

United States Patent [19]

Currie et al.

[11] Patent Number: 5,707,683
[45] Date of Patent: Jan. 13, 1998

[54] ELECTRONIC COATING COMPOSITION METHOD OF COATING AN ELECTRONIC SUBSTRATE, COMPOSITION AND ARTICLE

[75] Inventors: Alexander Brian Currie; Cathryn Marie Haines; Michael Dean Little; Keith Winton Michael, all of Midland; Kristen Andrea Scheibert, Sanford, all of Mich.

[73] Assignee: Dow Corning Corporation, Midland, Mich.

[21] Appl. No.: 605,576

[22] Filed: Feb. 22, 1996

[51] Int. Cl.⁶ .................................................. B05D 5/12
[52] U.S. Cl. .................. 427/126.2; 106/285; 106/286.4; 106/286.5; 106/287.13; 106/287.14; 106/287.15; 106/287.16; 106/287.23; 427/376.2; 427/376.3; 427/377; 428/688
[58] Field of Search .............................. 427/126.2, 376.2, 427/326.3, 377; 428/688; 106/285, 286.4, 286.5, 287.13, 287.14, 287.15, 287.16, 287.23

[56] References Cited

U.S. PATENT DOCUMENTS

| | | | |
|---|---|---|---|
| 4,749,631 | 6/1988 | Haluska et al. | 428/704 |
| 4,756,977 | 7/1988 | Haluska et al. | 428/704 |
| 5,145,723 | 9/1992 | Ballance et al. | 427/397.7 |
| 5,370,903 | 12/1994 | Mine et al. | 427/126.2 |
| 5,370,904 | 12/1994 | Mine et al. | 427/126.2 |
| 5,372,842 | 12/1994 | Mine et al. | 427/126.2 |
| 5,380,553 | 1/1995 | Loboda | 427/226 |
| 5,380,555 | 1/1995 | Mine et al. | 427/126.2 |
| 5,436,029 | 7/1995 | Ballance et al. | 427/126.2 |
| 5,605,867 | 2/1997 | Sato et al. | 437/235 |

*Primary Examiner*—Bernard Pianalto
*Attorney, Agent, or Firm*—Sharon K. Severance

[57] ABSTRACT

Disclosed are coating compositions which include a preceramic silicon-containing material dissolved in short chain linear siloxanes. The compositions have a long shelf life and are useful for forming coatings which are thick and of good quality.

25 Claims, No Drawings

ELECTRONIC COATING COMPOSITION METHOD OF COATING AN ELECTRONIC SUBSTRATE, COMPOSITION AND ARTICLE

BACKGROUND OF THE INVENTION

The present invention relates to an electronic coating composition containing a preceramic silicon-containing material. The composition comprises the preceramic silicon-containing material and a linear siloxane fluid.

Preceramic silicon-containing materials and their use in forming coatings on electronic devices is known in the art. For instance, U.S. Pat. Nos. 4,756,977 and 4,749,631 teach processes of forming coatings on electronic devices comprising diluting preceramic silicon-containing materials in solvents, applying the solutions to electronic devices and heating the coated devices to convert the preceramic materials to ceramics. The references, however, do not teach the linear siloxane carrier fluids claimed herein.

Similarly, patents such as U.S. Pat. No. 5,380,553 teach a variety of carrier fluids which can be used for preceramic silicon-containing materials. These include alcohols such as ethyl or isopropyl, aromatic hydrocarbons such as benzene or toluene, alkanes such as n-heptane or dodecane, ketones, cyclic dimethylpolysiloxanes, esters or glycol ethers. Again, this reference does not mention the linear siloxanes specifically claimed herein.

The present inventors have now discovered that specific linear siloxanes and blends thereof form stable solutions of the preceramic silicon-containing material which can be used to deposit coatings on electronic devices.

SUMMARY OF THE INVENTION

The present invention relates to an electronic coating composition. This composition contains between about 1 and about 50 weight percent preceramic silicon-containing material carried in linear siloxanes of the structure

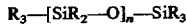

$$R_3\text{---[SiR}_2\text{---O]}_n\text{---SiR}_3$$

wherein each R is independently selected form hydrogen, an alkyl of 1–6 carbon atoms, an alkenyl or an aryl and n is 1–6.

DETAILED DESCRIPTION OF THE INVENTION

The present invention is based on the discovery that the carrier fluid used to deposit a coating of a preceramic silicon-containing material can have a dramatic effect on the resultant solution and coating. For instance, the carrier fluid can affect the stability of the solution, it can affect the quality of the resultant coating (eg., purity, dielectric constant, etc.) and it can affect the thickness of the resultant coating. Additionally, certain carrier fluids have adverse effects on the environment because they contain volatile organic compounds (VOCs).

Accordingly, the present inventors undertook an extensive review of carrier fluids and discovered that linear siloxane fluids and blends thereof can be used to form solutions of preceramic silicon-containing materials that have a long shelf life, even at room temperature, low VOC content and good compatibility with containers used to store these materials. These stable solutions, in turn, can be used to deposit coatings which have excellent quality and unexpected thickness.

Because of these advantages, the coating compositions of the present invention are particularly valuable on electronic substrates. Such coatings could serve, for example, as protective coatings, interlevel dielectric layers, doped dielectric layers to produce transistor like devices, pigment loaded binder systems containing silicon to produce capacitor and capacitor like devices, multilayer devices, 3-D devices, silicon on insulator devices, coatings for superconductors, super lattice devices and the like.

As used in the present invention, the expression "ceramic" is used to describe the hard, Si containing coatings obtained after heating the preceramic silicon-containing material. These coatings may contain silicon, carbon, nitrogen, oxygen or hydrogen such as silica ($SiO_2$), silica-like materials (eg., $HSiO_{3/2}$, SiO, $Si_2O_3$, etc.), silicon carbide, silicon nitride or the like which may not be fully free of residual carbon, silanol (Si-OH) and/or hydrogen. The expression "electronic substrate" is meant to include, but is not limited to, electronic devices or electronic circuits such as silicon based devices, gallium arsenide based devices, focal plane arrays, opto-electronic devices, photovoltaic cells and optical devices.

The compositions of the present invention contain between about 1 and about 50 weight percent preceramic silicon-containing material and preferably between about 5 and about 30 weight percent preceramic silicon-containing material in a carrier fluid.

As used in the present invention, the term "preceramic silicon-containing material" describes material which can be diluted in a carrier fluid, coated on the surface of an electronic device and converted to a solid layer exhibiting properties generally recognized by those skilled in the art as characteristic of a ceramic. These materials include, for example, precursors to silicon oxides, silicon nitride, silicon oxynitride, silicon oxycarbide, silicon carbonitride, silicon oxycarbonitride, silicon carbide and the like.

The preferred preceramic silicon-containing materials to be used in the process of this invention are precursors to silicon oxides, especially silica. The silicon oxide precursors which may be used in the invention include, but are not limited to, hydrogen silsesquioxane resin (H-resin), hydrolyzed or partially hydrolyzed $R_nSi(OR)_{4-n}$, or combinations of the above, in which each R is independently an aliphatic, alicyclic or aromatic substituent of 1–20 carbon atoms, preferably 1–4, such as an alkyl (eg. methyl, ethyl, propyl), alkenyl (eg. vinyl or allyl), alkynyl (eg. ethynyl), cyclopentyl, cyclohexyl, phenyl etc., and n is 0–3, preferably 0 or 1.

The H-resin which may be used in this invention includes hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, $x=0–2$, $y=0–2$, $z=1–3$, $x+y+z=3$. Examples of R include alkyls such as methyl, ethyl, propyl, butyl, etc., aryls such as phenyl, and alkenyls such as allyl or vinyl. These resins may be fully condensed $(HSiO_{3/2})_n$ or they may be only partially hydrolyzed (i.e., containing some Si-OR) and/or partially condensed (i.e., containing some Si-OH). Although not represented by this structure, these resins may also contain a small number (eg., less than about 10%) of silicon atoms which have either 0 or 2 hydrogen atoms attached thereto or a small number of SiC bonds due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fractions and methods for their preparation are taught by Hanneman et al. in U.S. Pat. Nos. 5,063,267 and 5,416,190 which are hereby incorporated by reference. A preferred fraction comprises material wherein at least 75% of the polymeric species have a molecular weight above about 1200 and a more preferred fraction comprises material wherein at least 75% of the polymeric species have a number average molecular weight between about 1200 and about 100,000.

The hydrogen silsesquioxane resin coating material may contain a platinum, rhodium or copper catalyst to increase the rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The second type of silica precursor material useful herein includes hydrolyzed or partially hydrolyzed compounds of the formula $R_nSi(OR)_{4-n}$ in which R and n are as defined above. Some of these materials are commercially available, for example, under the tradename ACCUGLASS (Allied Signal). Specific compounds of this type include methyltriethoxysilane, phenyltriethoxysilane, diethyldiethoxysilane, methyltrimethoxysilane, dimethyldimethoxysilane, phenyltrimethoxysilane, vinyltrimethoxysilane, tetramethoxysilane, tetraethoxysilane, tetrapropoxysilane, and tetrabutoxysilane. After hydrolysis or partial hydrolysis of these compounds, the silicon atoms therein may be bonded to C, OH or OR groups, but a substantial portion of the material is believed to be condensed in the form of soluble Si- O-Si resins. Compounds in which x=2 or 3 are generally not used alone as volatile cyclic structures are generated during pyrolysis, but small amounts of said compounds may be cohydrolyzed with other silanes to prepare useful preceramic materials.

In addition to the above silicon-oxide precursors, other ceramic oxide precursors may also be advantageously used herein either solely or in combination with the above silicon oxide precursors. The ceramic oxide precursors specifically contemplated herein include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed at relatively low temperatures to form ceramic oxides.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, other organic groups bonded to said metal or non-metal through an oxygen such as acetylacetonate or an amino groups. Specific compounds, therefore, include zirconium tetracetylacetonate, titanium dibutoxy diacetylacetonate, aluminum triacetylacetonate, tetraisobutoxy titanium and $Ti(N(CH_3)_2)_4$.

When a silicon oxide such as $SiO_2$ is to be combined with one of the above ceramic oxide precursors, generally it is used in an amount such that the final ceramic contains 70 to 99.9 percent by weight silicon oxide.

Examples of other silicon-containing preceramic materials include silicon carbonitride precursors such as hydridopolysilazane (HPZ) resin and methylpolydisilylazane (MPDZ) resin. Processes for the production of these materials are described in U.S. Pat. Nos. 4,540,803 and 4,340,619, respectively, both of which are incorporated herein by reference. Examples of silicon carbide precursors include polycarbosilanes and examples of silicon nitride precursors include polysilazanes. Oxygen can be incorporated into the ceramics resulting from the above precursors or the precursors can be converted to silica by pyrolyzing them in an oxygen-containing environment. Mixtures of silicon-containing preceramic materials may also be used.

The carrier fluids used in the present invention are linear siloxanes of the structure

$$R_3-[SiR_2-O]_n-SiR_3$$

wherein each R is independently hydrogen, an alkyl of 1–6 carbon atoms such as methyl, ethyl, propyl, butyl, etc., an alkenyl such a vinyl or an aryl such as phenyl and n is 1–6. Preferably, R is an alkyl of 1–3 carbon atoms and n is 1 or 2.

The most preferred carrier fluids are hexamethyldisiloxane and octamethyltrisiloxane. Hexamethyldisiloxane has a viscosity of 0.65 mm²/second at 25° C. Octamethyltrisiloxane has a viscosity of 1 mm²/second at 25° C.

Mixtures of the above carrier fluids can also be used. For instance, hexamethyldisiloxane can be mixed with octamethyltrisiloxane or decamethyltetrasiloxane in a ratio of 10:90 to 90:10.

These linear siloxanes and methods for their manufacture are known in the art. For instance, Noll in "Chemistry and Technology of Silicones" (Academic Press- 1960) teaches these specific materials and the hydrolytic and non-hydrolytic processes for obtaining them from a variety of silanes.

Generally, these linear siloxanes should be purified to avoid contamination of the coating solution which may result in instability. Similarly, impurities may result in detrimental properties in the resultant coating. Purification techniques are known in the art and are exemplified by filtration, distillation, and a host of other separation techniques.

The compositions of the present invention can generally also contain minor amounts (eg., less than 5 wt %) of other carrier fluids or additives such as cyclic siloxanes without affecting the invention.

The above formulations consistently provide solutions with long shelf-life. In fact, these solutions even have reasonable shelf lives at room temperature. By contrast, other solutions of preceramic silicon-containing materials such as hydrogen silsesquioxane resin and similar silica precursors require refrigeration for reasonable shelf life and, even then the shelf life is often only days as compared to the months achieved herein.

Additionally, these formulations are compatible with a variety of containers used to hold such materials. By contrast, other carrier fluids require the use specific containers which will not react with the formulations.

Similarly, the solutions of the present invention have low levels of VOCs. By contrast, other carrier fluids proposed for preceramic silicon-containing materials are often organic and can have detrimental effects on the environment.

Finally, solutions of preceramic silicon-containing materials such as hydrogen silsesquioxane resin in the linear siloxanes of the present invention can have the advantage of delivering coatings with thicknesses comparable to higher concentrations of preceramic material in other carrier fluids. As such, these linear siloxane solutions have a distinct economic advantage.

The compositions of the present invention can be used to coat electronic substrates with ceramic coatings. Generally, the process of forming such coatings comprises first applying the coating composition onto an electronic substrate. If desired the coating can then be "flowed" by heating under an inert atmosphere and, thus, causing the coating to be leveled. The coated electronic substrate can then be heated to a temperature in the range of about 50° to about 800° C. in an appropriate environment (eg., oxidizing (air, ozone, ammonia, etc) or inert (eg., nitrogen)) to convert the coating composition into a ceramic coating.

The coatings which result from the compositions of the present invention are of high quality (eg., purity, dielectric constant, etc.) and have desirable thicknesses. It should be recognized, however, that thickness variations in the coatings are also affected by factors such as spin speed and preceramic material concentration: These factors should be taken into account when producing coatings with these compositions.

The following non-limiting examples are included so that one skilled in the art may more readily understand the invention.

EXAMPLE 1

Stability Testing

The following test was performed to compare the stability of H-resin in the linear siloxanes of the present invention with other carrier fluids for this material reported in the literature. H-resin (made by the method of Collins et al. in U.S. Pat. No. 3,615,272) was diluted to 50 wt % in the carrier fluids listed in Table 1 and stored at room temperature in one ounce glass vials. The solutions were then visually observed until they gelled. The results are presented in Table 1.

TABLE 1

| Carrier Fluid | Time to Gel |
| --- | --- |
| Methyl Isobutylketone | 6–117 days |
| n-Butyl Acetate | 8–43 days |
| Octane | >4 months |
| Octamethylcyclotetrasiloxane | 98 + days |
| Hexamethyldisiloxane | >3 months |
| Octamethyltrisiloxane | >5 months |
| Decamethyltetrasiloxane | 132 + days |
| Silicone Fluid 10 mm$^2$/sec viscosity | 0 |

As is apparent, the linear siloxanes taught herein have stabilities at least equivalent to those of the other carrier fluids.

EXAMPLE 2

The H-resin of Example 1 was diluted to 18 wt. % solids in the carrier fluids listed in Table 2. These compositions were applied to the surface of silicon wafers and spun at 3000 RPM on a Semix Spin Coater for 10 seconds. The coated wafer was then heated to allow the resin to melt and flow. This heating was conducted at 150° C. for 1 minute, 200° C. for 1 minute and 350° C. for 1 minute under a nitrogen atmosphere. The coating was then converted to a ceramic by ramping the temperature up between 40° and 400° C. over 1 hour, holding the temperature at 400° C. for 1 hour and ramping the temperature down from 400° to 40° C. over 1 hour under a nitrogen atmosphere.

A Nanometrics Nanospec AFT System was used to determine the thickness of the coatings as spun, after flowing and after conversion. The visual quality was reduced to a numerical value between 1 (good) and 5 (poor) and recorded as a response. The results of this experiment are provided in Table 2.

TABLE 2

| Carrier Fluid | Thickness (nm) per % Solids Conc. | | | Quality | Metal | Particles | ppm Water Content |
| --- | --- | --- | --- | --- | --- | --- | --- |
| | As-spun | Flowed | Converted | | | | |
| N-Butyl Acetate | 19.16 | 18.57 | 18.51 | 1 | Na = 30 | 2–4 | 235 |
| D4 | 16.95 | 13.36 | 13.15 | 3 | — | 7 | 47.5 |
| MIBK | 20.43 | 19.08 | 19.18 | 1 | — | 3.2 | 628 |
| | | | | | | 6 | |
| | | | | | | 3.8 | |
| Octane | 16.30 | 15.19 | 15.04 | 1 | — | 56 | 29 |
| | 16.36 | 15.29 | 15.25 | 2 | — | 173 | 29 |
| | 16.82 | 14.71 | 14.63 | 1 | — | 435 | 26 |

TABLE 2-continued

| Carrier Fluid | Thickness (nm) per % Solids Conc. | | | Quality | Metal | Particles | ppm Water Content |
|---|---|---|---|---|---|---|---|
| | As-spun | Flowed | Converted | | | | |
| | 16.63 | 15.57 | 15.54 | 1 | — | 6–10 | 31 |
| HMDS | 30.02 | 27.55 | 27.5 | 3 | — | 6.10 | 61 |
| | | | | 5 | — | 7.4 | |
| OMTS | 17.28 | 14.58 | 14.34 | 1 | — | 17 | 108 |
| DMTS | 10.14 | 8.97 | 9.00 | 1–2 | — | 49 | 151 |
| 50% HMDS/50% OMTS | 26.00 | 23.15 | 23.26 | 5 | — | 6 | — |
| 40% HMDS/60% OMTS | 24.17 | 21.56 | 21.31 | 1 | — | 2 | — |
| 30% HMDS/70% OMTS | 22.61 | 20.31 | 20.17 | 1 | — | 1 | — |
| 20% HMDS/80% OMTS | 19.75 | 17.52 | 17.41 | 1.2 | — | 3 | — |
| 10% HMDS/90% OMTS | 18.66 | 16.49 | 16.26 | 1.6 | — | 1 | — |

D4 = Octamethylcyclotetrasiloxane; MIBK = Methyl Isobutylketone; HMDS = Hexamethyldisiloxane; OMTS = Octamethyltrisiloxane; DMTS = Decamethyltetrasiloxane That which is claimed is:

1. A coating composition comprising:
   about 1 and about 50 weight percent preceramic silicon-containing material and about 50 to about 99 weight percent of a mixture of hexamethyldisiloxane and octamethyltrisiloxane in a ratio of 10:90 to 90:10.

2. The coating composition of claim 1 wherein the preceramic silicon-containing material is selected from the group consisting of hydrogen silsesquioxane resin, hydrolyzed or partially hydrolyzed $R_nSi(OR)_{4-n}$, or combinations thereof, wherein each R is independently an aliphatic, alicyclic or aromatic substituent of 1–20 carbon atoms and n is 0–3.

3. The coating composition of claim 2 also containing modifying ceramic oxide precursors comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that a silica coating formed from the coating composition contains 0.1 to 30 percent by weight modifying ceramic oxide.

4. The composition as claimed in claim 1 wherein the hexamethyldisiloxane and octamethyltrisiloxane are in a ratio of 10:90 to 40:60.

5. A coating composition comprising:
   about 1 and about 50 weight percent hydrogen silsesquioxane resin and about 50 to about 99 weight percent of a mixture of hexamethyldisiloxane and octamethyltrisiloxane in a ratio of 10:90 to 90:10.

6. The coating composition of claim 5 also containing a platinum, rhodium or copper catalyst in an amount of between about 5 and about 1000 ppm platinum, rhodium or copper based on the weight of hydrogen silsesquioxane resin.

7. The coating composition of claim 5 wherein the composition comprises hydrogen silsesquioxane resin in an amount between about 5 and about 30 weight percent.

8. A method of coating an electronic substrate comprising:
   applying a coating composition comprising about 1 and about 50 weight percent preceramic silicon-containing material and about 50 to about 99 weight percent of a mixture of hexamethyldisiloxane and octamethyltrisiloxane in a ratio of 10:90 to 90:10 onto an electronic substrate.

9. A method of coating an electronic substrate as claimed in claim 8 wherein the coated electronic substrate is thereafter heated to a temperature in the range of about 50° to 800° C. to convert the coating composition into a ceramic coating.

10. The coated electronic substrate produced by the method of claim 9.

11. A method of coating an electronic substrate as claimed in claim 8 wherein the coated substrate is thereafter heated in an inert atmosphere to a temperature above the melting point of the preceramic silicon-containing material to cause the coating to flow.

12. The coated electronic substrate produced by the method of claim 11.

13. The coated electronic substrate produced by the method of claim 8.

14. A method of coating an electronic substrate comprising:
   applying a coating composition comprising about 1 and about 50 weight percent hydrogen silsesquioxane resin and about 50 to about 99 weight percent of a mixture of hexamethyldisiloxane and octamethyltrisiloxane in a ratio of 10:90 to 90:10 onto an electronic substrate.

15. A method of coating an electronic substrate as claimed in claim 14 wherein the coated substrate is thereafter heated in an inert atmosphere to a temperature above the melting point of the preceramic silicon-containing material to cause the coating to flow.

16. The coated electronic substrate produced by the method of claim 15.

17. A method of coating an electronic substrate as claimed in claim 14 wherein the coated electronic substrate is thereafter heated to a temperature in the range of about 50° to 800° C. to convert the coating composition into a ceramic coating.

18. The coated electronic substrate produced by the method of claim 17.

19. The coated electronic substrate produced by the method of claim 14.

20. A coating composition comprising about 1 to about 50 weight percent preceramic silicon-containing material and about 50 to about 99 weight percent octamethyltrisiloxane.

21. The coating composition as claimed in claim 20 wherein the preceramic silicon-containing material is hydrogen silsesquioxane resin.

22. A coating composition comprising about 1 and about 50 weight percent preceramic silicon-containing material and about 50 to about 99 weight percent decamethyltetrasiloxane.

23. The coating composition as claimed in claim 22 wherein the coating composition is hydrogen silsesquioxane resin.

24. A method of coating an electronic substrate comprising:

applying a coating composition comprising about 1 to about 50 weight percent preceramic silicon-containing material and about 50 to about 99 weight percent of a linear siloxane selected from the group consisting of octamethyltrisiloxane and decamethyltetrasiloxane onto an electronic substrate; and heating the coated electronic substrate to a temperature in the range of about 50° C. to about 800° C. to convert the coating composition into a ceramic coating.

25. The coated electronic substrate produced by the method of claim 24.

* * * * *